United States Patent
Dhong et al.

(10) Patent No.: US 6,292,027 B1
(45) Date of Patent: Sep. 18, 2001

(54) FAST LOW-POWER LOGIC GATES AND METHOD FOR EVALUATING LOGIC SIGNALS

(75) Inventors: Sand Hoo Dhong; Hung Cai Ngo; Jaehong Park, all of Austin; Osamu Takahashi, Round Rock, all of TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/440,758

(22) Filed: Nov. 16, 1999

(51) Int. Cl.[7] ............... H03K 19/094; H03K 19/0175
(52) U.S. Cl. ............... 326/83; 326/113; 326/119
(58) Field of Search .................. 326/113, 82, 83, 326/95, 98, 121, 119

(56) References Cited

U.S. PATENT DOCUMENTS

| | | | |
|---|---|---|---|
| 4,390,988 | * 6/1983 | Best et al. | 370/534 |
| 4,577,124 | * 3/1986 | Koike | 326/113 |
| 5,539,336 | * 7/1996 | Nguyen et al. | 326/83 |
| 5,910,735 | * 6/1999 | Allen | 326/93 |
| 5,926,038 | * 7/1999 | Fouts et al. | 326/95 |

* cited by examiner

Primary Examiner—Michael Tokar
Assistant Examiner—Daniel D. Chang
(74) Attorney, Agent, or Firm—Casimer K. Salys; Bracewell & Patterson, L.L.P.

(57) ABSTRACT

Fast low-power logic gates and method for evaluating logic signals reduce the effect of the power/speed tradeoff for parallel connected logic. A control circuit momentarily enables a high-current pullup or pulldown device after a connected input ladder switches from a conducting state to a non-conducting state. This allows a high current pullup or pulldown to be used for fast evaluation without increasing overall current drain, since the pullup action is momentary.

18 Claims, 8 Drawing Sheets

FAST LOW-POWER LOGIC GATES AND METHOD FOR EVALUATING LOGIC SIGNALS

BACKGROUND OF THE INVENTION

1. Technical Field

The present invention generally relates to logic gates, and more particularly to static logic gates with low power consumption and short evaluation times.

2. Description of the Related Art

Logic circuits, particularly those used to simultaneously evaluate an equation with a large number of inputs have been implemented in a variety of architectures. Among static logic gates, which require no preset signals and maintain their output state as long as the input signals remain in the same state, two standard architectures are well known in Metal-Oxide-Semiconductor (MOS) implementations.

Figure 1A:
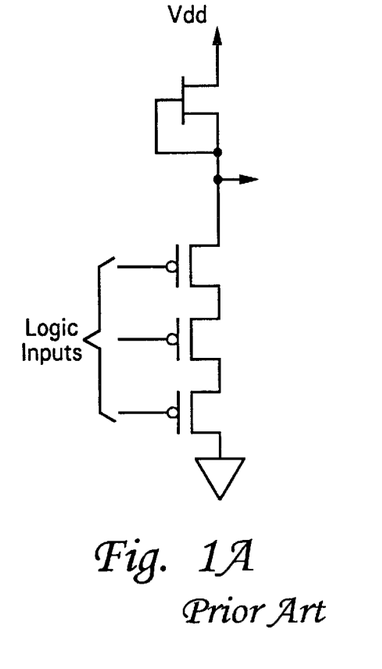
FIG. 1A is a simplified electrical schematic of a prior art OR gate.
Figure 1B:
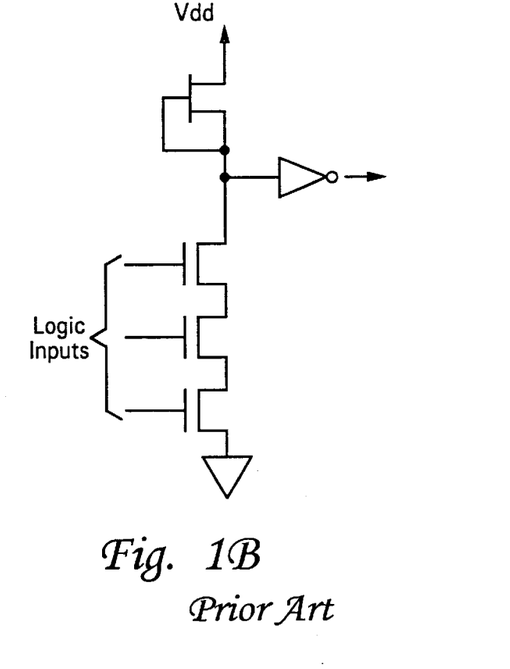
FIG. 1B is a simplified electrical schematic of a prior art AND gate.

In order to evaluate an OR equation, as shown in FIG. 1A, ladders of PMOS transistors (with each gate coupled to a logic input and the bottom of the ladder connected to ground) are stacked in series so that if any logic input is high, the ladder will not conduct and therefore produce a logic high output at the top of the ladder. In order to evaluate an AND equation, a similar ladder can be formed by NMOS transistors, as shown in FIG. 1B so that if any gate is low, the ladder will not conduct, producing a high output that is inverted to produce the AND result.

This topology has a disadvantage in that the logic gates that use it are slow. As terms are added to the equations, transistors are added to the ladder. The resistance of the ladder controls the rate at which the voltage at the top of the ladder may be discharged when the ladder turns on, and therefore large transistor sizes are needed to achieve faster switching times. Also, using larger area raises the gate capacitance which may remove any benefit from the increased area of the transistors, since the input signals will be delayed by the effect of increased capacitance.

Figure 1C:
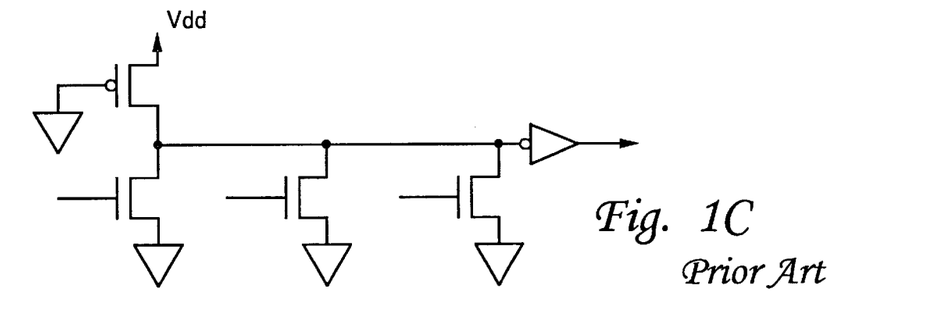
FIG. 1C is a simplified electrical schematic of a prior art wide OR gate.
Figure 1D:
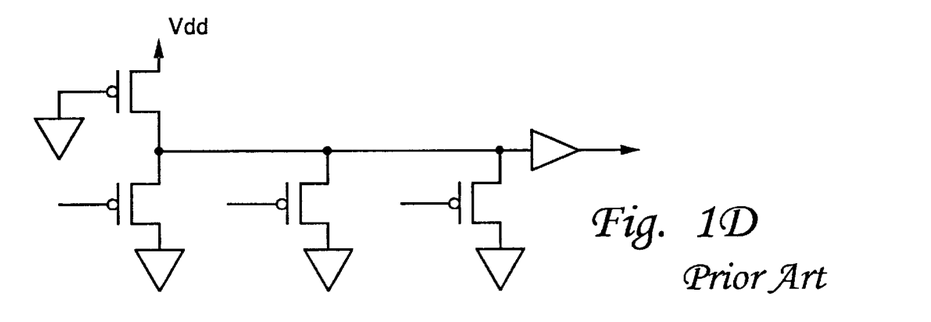
FIG. 1D is a simplified electrical schematic of a prior art wide AND gate.

Alternative topologies, known in the art, are the wide OR and deep AND topologies. The wide OR, shown in FIG. 1C, evaluates an OR equation by a drain-parallel connection of N-channel transistors coupled each to a logic input with their sources connected to ground. If any of the inputs are high, the individual transistors connected to them will conduct, pulling the node of parallel connection low. This signal can then be inverted to produce an OR output. For the deep AND, shown in FIG. 1D, a source-parallel connection of P-channel transistors with gates connected each to a logic input and their drains connected to a power signal is constructed. If any of the inputs are low, those transistors connected to those inputs will conduct, pulling the node of parallel connection high. This connection can then be inverted to produce an AND output.

A limitation of the wide OR and deep AND topologies is that a pullup (in the case of the wide OR) or pulldown (in the case of deep AND) circuit must be present for the node to be set to a proper voltage level when all of the input transistors are not conducting. (Without a pullup or pulldown, the node of parallel connection would be in a high impedance state when all transistors are off.) This pullup or pulldown is typically provided by a transistor. For the wide OR topology and deep AND technology, the pullup is usually a P-channel transistor connected to a power signal, sized to limit the current consumed when the summing node is pulled low.

The pullup or pulldown transistor must be appropriately sized so that when the logic circuit goes from a state in which all transistors are off to a state in which at least one transistor is on, the voltage at the node of parallel connection is quickly changed to the appropriate rail. Disadvantageously, the faster this change is made (due to a larger-sized pullup or pulldown), the more current is drawn through the logic gate when at least one of the transistors is held in the conducting state. For these topologies, evaluation speed and power consumption are a design tradeoff.

It would therefore be desirable to improve these and other topologies so that evaluation speed can be increased without a concomitant increase in power consumption.

SUMMARY OF THE INVENTION

It is therefore one object of the present invention to provide a logic circuit with reduced evaluation time.

It is therefore one object of the present invention to provide a logic circuit with reduced evaluation time without a corresponding increase in power consumption.

It is therefore another object of the present invention to provide a wide OR and deep AND topology wherein evaluation time can be decreased without a corresponding increase in power consumption.

The foregoing objects are achieved in an enhanced logic gate that includes a control means for momentarily enabling a pullup or pulldown transistor associated with an input ladder when the input signal changes so as to cause the ladder not to conduct. The logic gate further may include a plurality of input ladders comprising a plurality of transistors, in which an associated control means and pulling means is associated with each transistor and each of the control means enables the associated pulling means momentarily when its associated transistor is switched off. The control means may be accomplished with a pass gate coupling the logic input to the pulling means and the pass gate may be enabled by the logic input, or by an inverted logic input, and a delay may be provided to disable the pass gate. The logic gate may include a keeper circuit to maintain a summing node state when no input ladders or pulling means are conducting.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like numbers correspond to like elements and further:

DETAILED DESCRIPTION OF ILLUSTRATIVE EMBODIMENT

Figure 2:
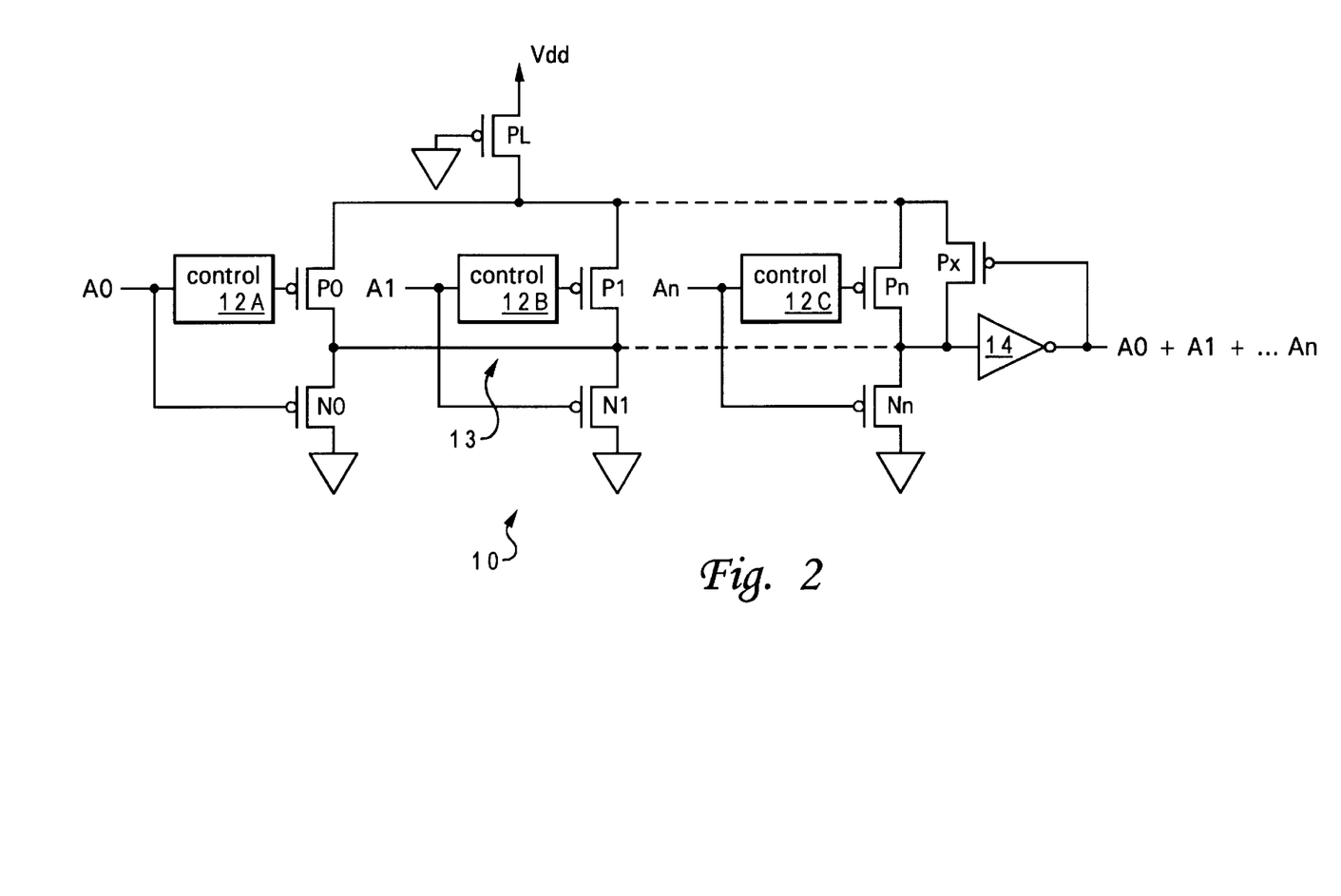
FIG. 2 is an electrical schematic of a wide OR logic gate in accordance with an embodiment of the present invention.

With reference now to the figures, and in particular with reference to FIG. 2, there is depicted an enhanced static logic circuit constructed in accordance with one embodiment of the present invention. This is an example a wide OR static logic gate 10, with improvements in accordance with present invention included.

Wide OR gate 10 takes inputs A0 through An and generates an output A0+A1+ . . . An, where "+" indicates a logical OR operator, and both the drawing and the equation are drawn to illustrate that more input ladders can be connected to summing node 13, in order to add more "OR" terms to the equation. NMOS ladder transistors N0 through Nn are connected to summing node 13. (The logic input transistors will be referred to as ladder transistors, even though in the present example, there is only one transistor in each ladder.) If any of inputs A0 through An are in a logic high state, the NMOS transistors connected to those inputs will turn on, pulling summing node 13 to ground. Pullup PMOS transistors P0 through Pn are enabled by control circuits 12. PMOS transistor PL limits the total current available to charge summing node 13, so that if more than one pullup transistor is enabled, the total current available to charge summing node 13 will remain essentially constant, allowing total current drain to be constrained while providing an essentially constant evaluation delay no matter how many inputs are changing when summing node 13 transitions from a logic low state to a logic high state. Control circuits 12 are coupled to inputs A0 through An and act to momentarily turn on the PMOS device coupled to their outputs when the input connected to control 12 transitions from logic high to logic low. This momentary action guarantees that when the last input transitions to a low logic level, pullup current will be available to charge summing node 13 to the high logic state. For example, in a gate designed to evaluate a logic equation in 100 picoseconds, the control circuit might be designed so that the momentary action of control 12 enables the pulling device for 10 picoseconds, which reduces the current wasted when one of the ladder devices is conducting to 10 percent of what it would be without the momentary action of control 12.

Inverter 14 inverts the logic value of summing node 13, which will be in a high state only if all inputs are at a low logic state (corresponding to a logical NOR function) to produce a logical OR output. Keeper transistor Px is present to provide feedback so that when the pullup action of the last PMOS pullup transistor has ceased (due to the end of the momentary output of control 12), summing node 13 is maintained in the high state when all of the NMOS ladder transistors are off. When any of the NMOS ladder transistors are on, summing node 13 will be pulled to ground by those transistors.

Figure 3:
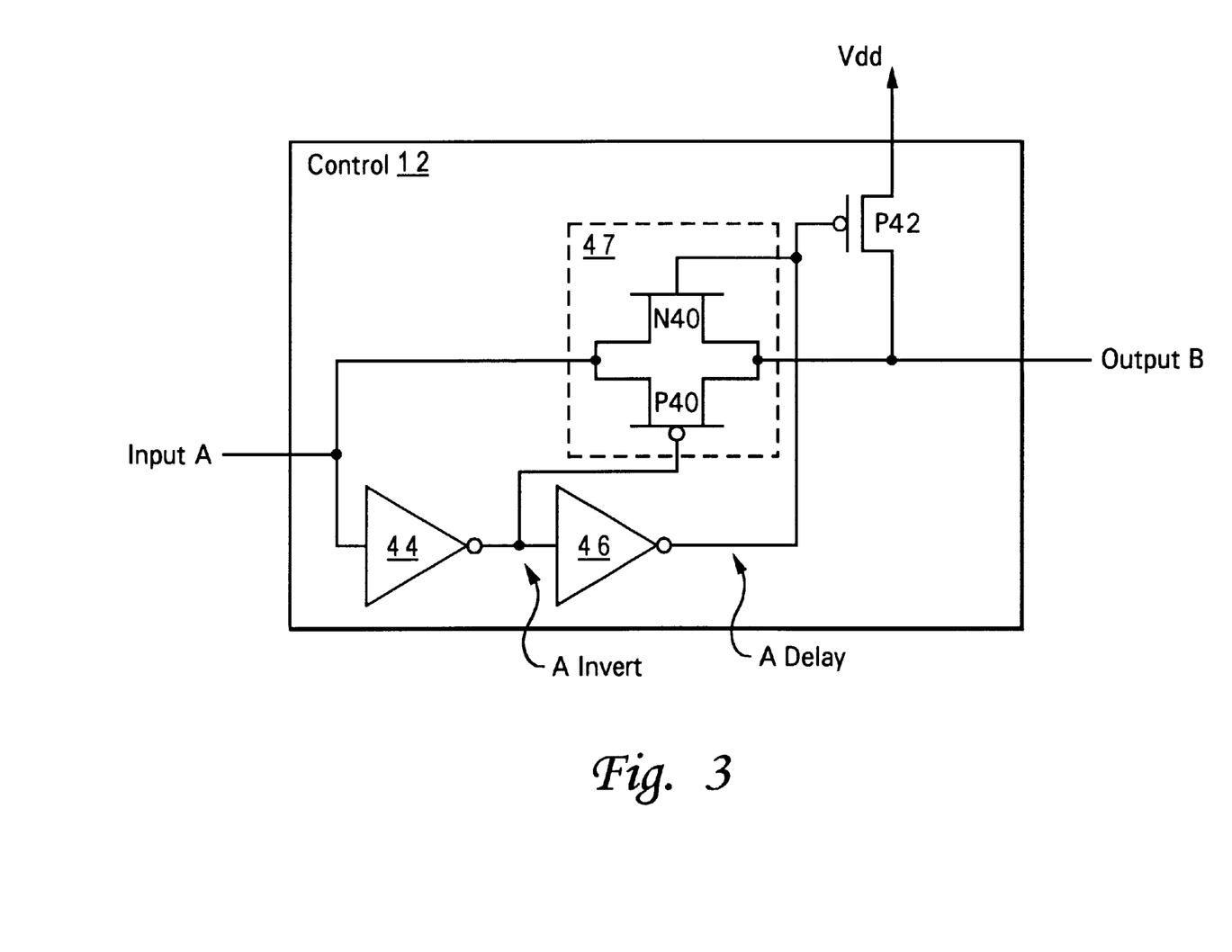
FIG. 3 is an electrical schematic of a control block in accordance with the embodiment of embodiment of FIG. 2.

Referring now to FIG. 3 an embodiment of control 12 is illustrated in schematic form. Input A is passed by a pass gate 47 formed by NMOS transistor N40 and PMOS transistor P40 to the output which is used to control the pullup transistor associated with each ladder transistor in FIG. 2. A second pullup transistor P42 within control 12 itself, acts to charge Output B to a logic high state after pass gate 47 is disabled. This causes the pullup transistor P0 through Pn connected to the particular control 12 to turn off.

Figure 4:
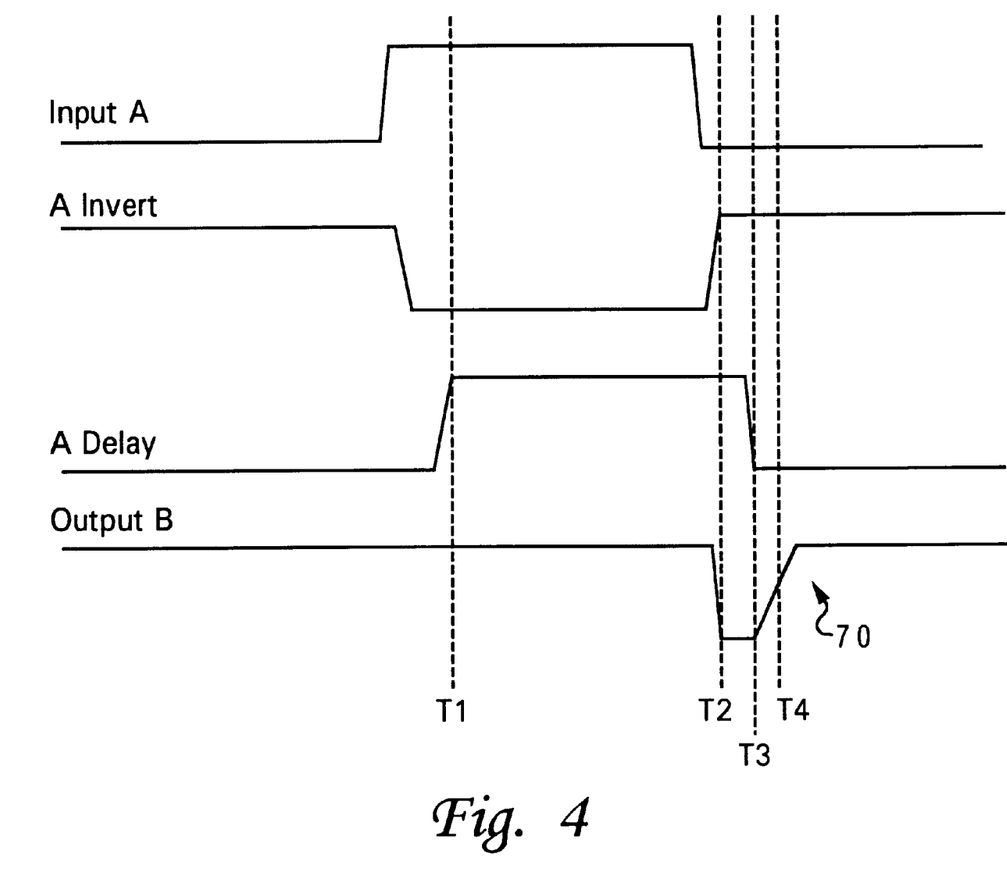
FIG. 4 is an electrical timing diagram showing the relationship of voltages in the operation of the circuit of FIG. 3.

Control of pass gate 47 is provided by Input A. Input A is first inverted by inverter 44 which also may provide some delay. This inverted signal is used to turn on PMOS transistor P40 so that as Input A falls from high to low, first P40 will turn off as A Invert rises, then N40 will turn off as A Delay falls. Control 12 would operate without P40, but performance has been improved by adding a full pass gate, rather than just NMOS transistor N40. Inverted signal A Invert is inverted again by inverter 46 to produce a delayed version of Input A, A Delay. This signal keeps NMOS transistor N40 on after Input A changes from high to low, presenting a low value at Output B until A Delay falls from high to low. Depending on the design of inverter 46 the length of time that Output B is pulled low can be varied. The rate at which P42 charges Output B also controls the charging of summing node 13. The length of time necessary to properly charge summing node 13 and the size of devices P0 through Px will determine inverter design and sizing of P42 to produce the proper delay. Referring additionally to FIG. 4, the relationships of signals in control 12 is seen. After Input A transitions from logic high to logic low, A delay is still logic high, keeping pass gate 13 enabled. Output B now falls to a logic low (at time T2) since the input to pass gate is Input A which is now low. When A Delay falls to logic low at time T3, Output B charges again to logic high through P42, due to the turn off of N40 and P40. The slope 70 of the charging of P42 further controls the amount of time pullups P0 through Pn will be active when their associated inputs switch. At T1 it can be observed that no switching of Output B occurs, due to Input A transitioning high before pass gate 13 is enabled by A Invert changing to a logic low state and A Delay changing to a logic high state. Therefore, a logic high is constantly reflected as pass gate 47 is enabled.

Figure 5:
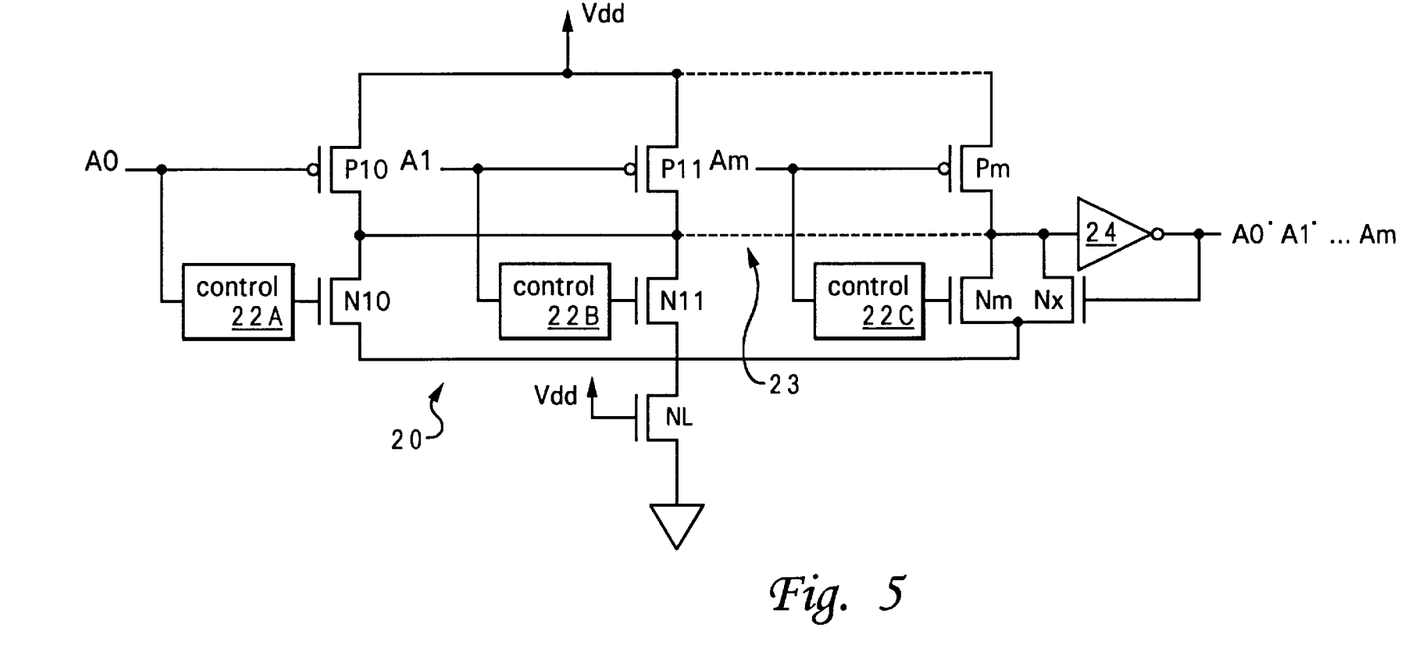
FIG. 5 is an electrical schematic of a deep AND logic gate in accordance with another embodiment of the present invention.

Referring now to FIG. 5, a second embodiment of the present invention is depicted. This embodiment is a deep AND static logic gate. For this topology, the roles of the PMOS and NMOS transistors are reversed, as is the operation of Control 22.

Deep AND gate 20 takes inputs A0 through Am and generates an output A0·A1· . . . Am, where "·" indicates a logical AND operator, and both the drawing and the equation are drawn to illustrate that more input ladders can be connected to summing node 23, in order to add more "AND" terms to the equation. PMOS ladder transistors P10 through Pm are connected to summing node 23. If any of inputs A0 through Am are in a logic low state, the PMOS transistors connected to those inputs will turn on, pulling summing node 23 to Vdd, the positive rail. Pulldown NMOS transistors N10 through Nm are enabled by control circuits 22. NMOS transistor NL acts limits the total current that can be drawn from summing node 23 to ground, so that if more than one pulldown transistor is enabled, the total current drawn from summing node 23 will remain essentially constant, allowing total current drain to be constrained while providing an essentially constant evaluation delay no matter how many inputs are changing when summing node 23 transitions from a logic high state to a logic low state. Control circuits 22 are coupled to inputs A0 through Am and act to momentarily turn on the NMOS device coupled to their outputs when the input connected to control 22 transitions from logic high to logic low. This momentary action guarantees that when the last input transitions to a high logic level, current can be drawn from summing node 23 to bring it quickly to the low logic state.

Inverter 24 inverts the logic value of summing node 23, which will be in a logic low state only if all inputs are at a low high state (corresponding to a logical NAND function) to produce a logical AND output. Keeper transistor Nx is present to provide feedback so that when the pulldown action of the last NMOS pullup transistor has ceased (due to the end of the momentary output of control 22, summing node 23 is maintained in the high state when all of the PMOS ladder transistors are off. When any of the PMOS ladder transistors are on, summing node 23 will be pulled to Vdd by those transistors.

Figure 6:
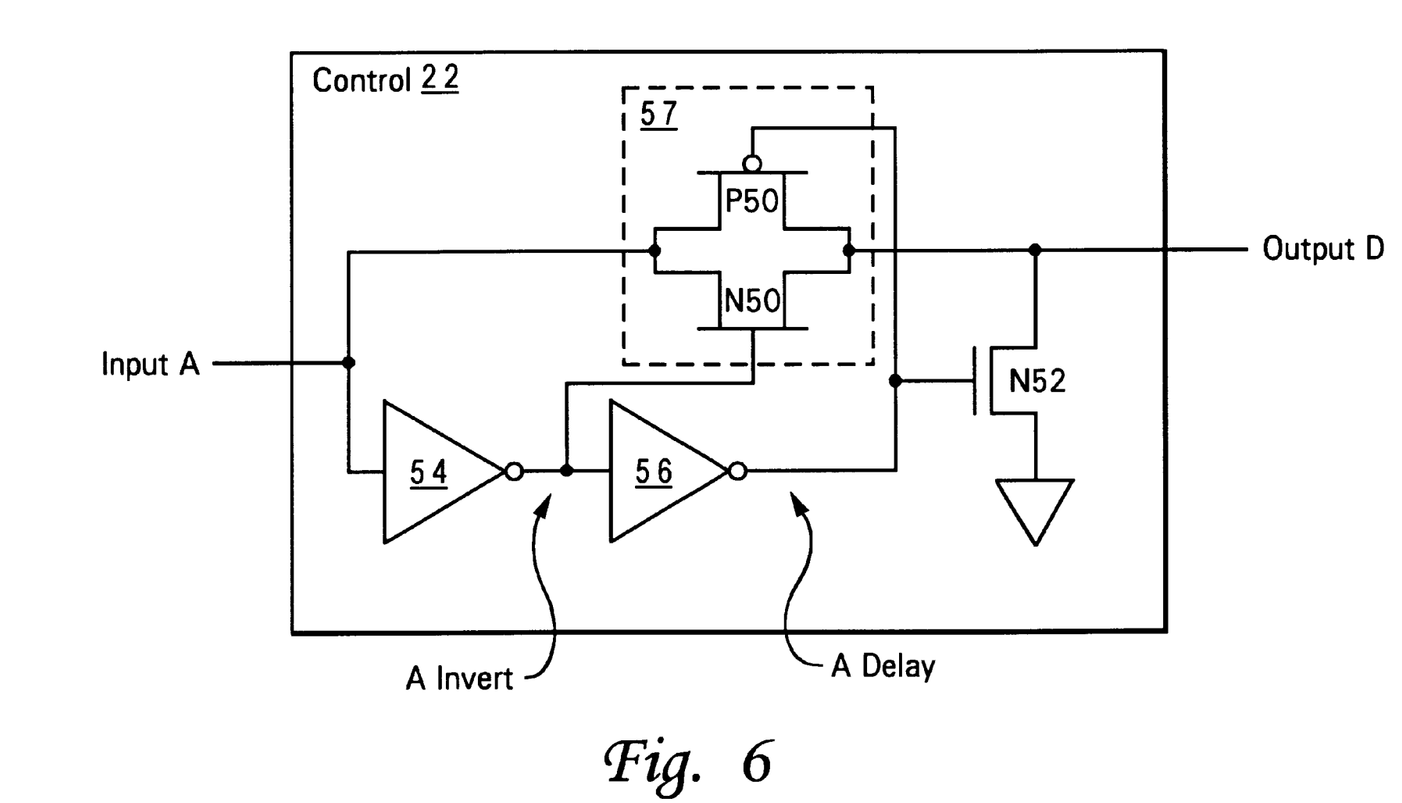
FIG. 6 is an electrical schematic of a control block in accordance with the embodiment of FIG. 5.

Referring now to FIG. 6 an embodiment of control 22 is illustrated in schematic form. Input A is passed by a pass gate 57 formed by NMOS transistor N50 and PMOS transistor P50 to the output which is used to control the pulldown transistor associated with each ladder transistor in FIG. 5. A second pulldown transistor N52 within control 22 itself, acts to discharge Output D to a logic low state after pass gate 57 is disabled. This causes the pulldown transistor A0 through Am connected to the particular control 22 to turn off.

Figure 7:
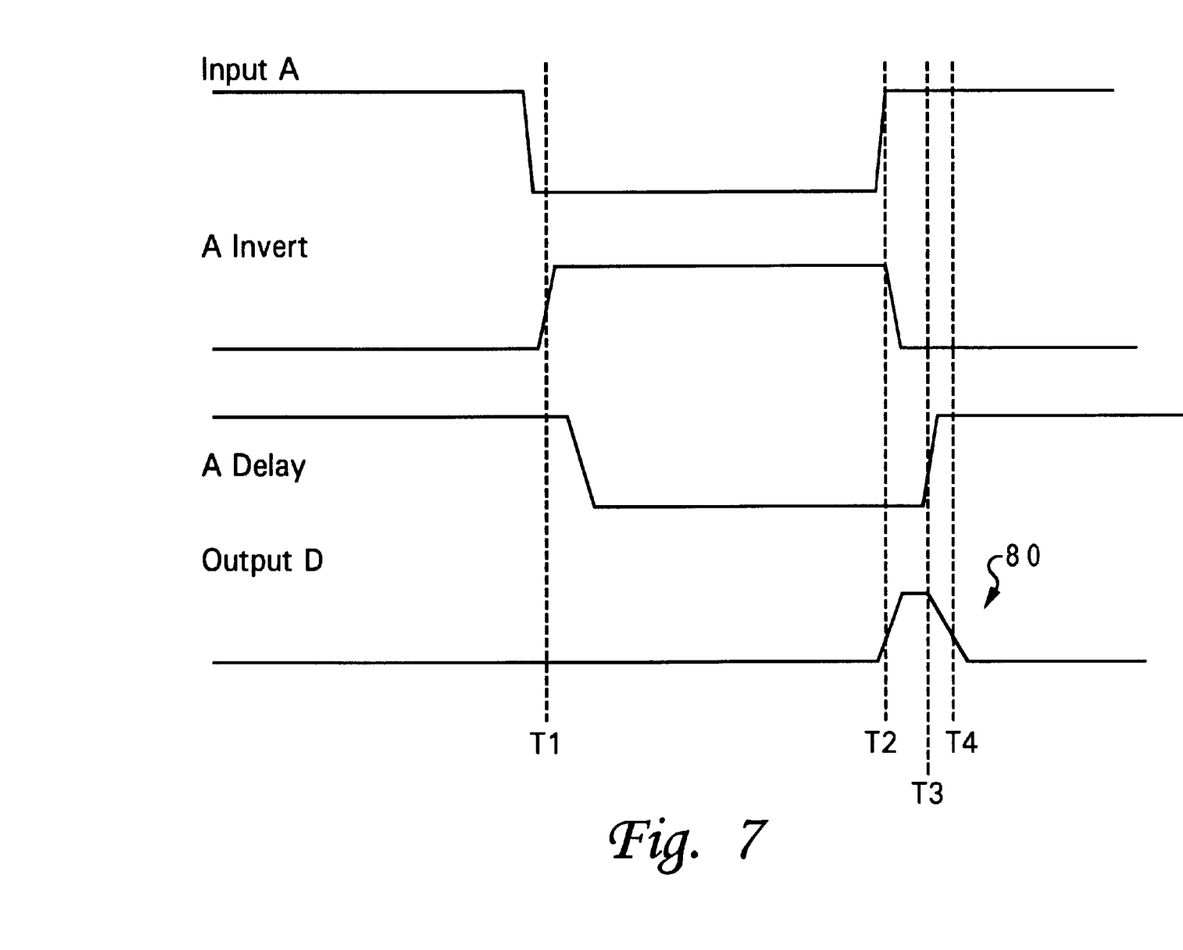
FIG. 7 is an electrical timing diagram showing the relationship of voltages in the operation of the circuit of FIG. 5.

Control of pass gate 57 is provided by Input A. Input A is first inverted by inverter 54 which also may provide some delay. This inverted signal is used to turn on NMOS transistor N50 so that as Input A rises from logic low to logic high, first N50 will turn off as A Invert falls, then P50 will turn off as A Delay rises. Control 22 would operate without N50, but performance has been improved by adding a full pass gate, rather than just PMOS transistor P50. Inverted signal A Invert is inverted again by inverter 46 to produce a delayed version of Input A, A Delay. This signal keeps PMOS transistor P50 on after Input A changes from low to high, presenting a high value at Output D until A Delay rises from low to high. Depending on the design of inverter 56 the length of time that Output D is driven high can be varied. The rate at which N52 discharges Output D also controls the discharging of summing node 23. The length of time necessary to properly discharge summing node 23 and the size of devices N0 through Nm will determine inverter design and sizing of N52 to produce the proper delay. Referring additionally to FIG. 7, the relationships of signals in control 22 is seen. After Input A transitions from logic low to logic high, A delay is still logic low, keeping pass gate 23 enabled. Output D now rises to a logic high (at time T2) since the input to pass gate is Input A which is now high. When A Delay rises to logic high at time T3, Output D discharges again to logic low through N52, due to the turn off of N40 and P40. The slope 80 of the discharging of Output D further controls the amount of time pulldowns N0 through Nm will be active when their associated inputs switch. At T1 it can be observed that no switching of Output D occurs, due to the fact that Input A transitions low before pass gate 23 is enabled by A Invert changing to a logic high state and A Delay changing to a logic low state. Therefore a constant logic low level is maintained as pass gate 23 is enabled.

Figure 8:
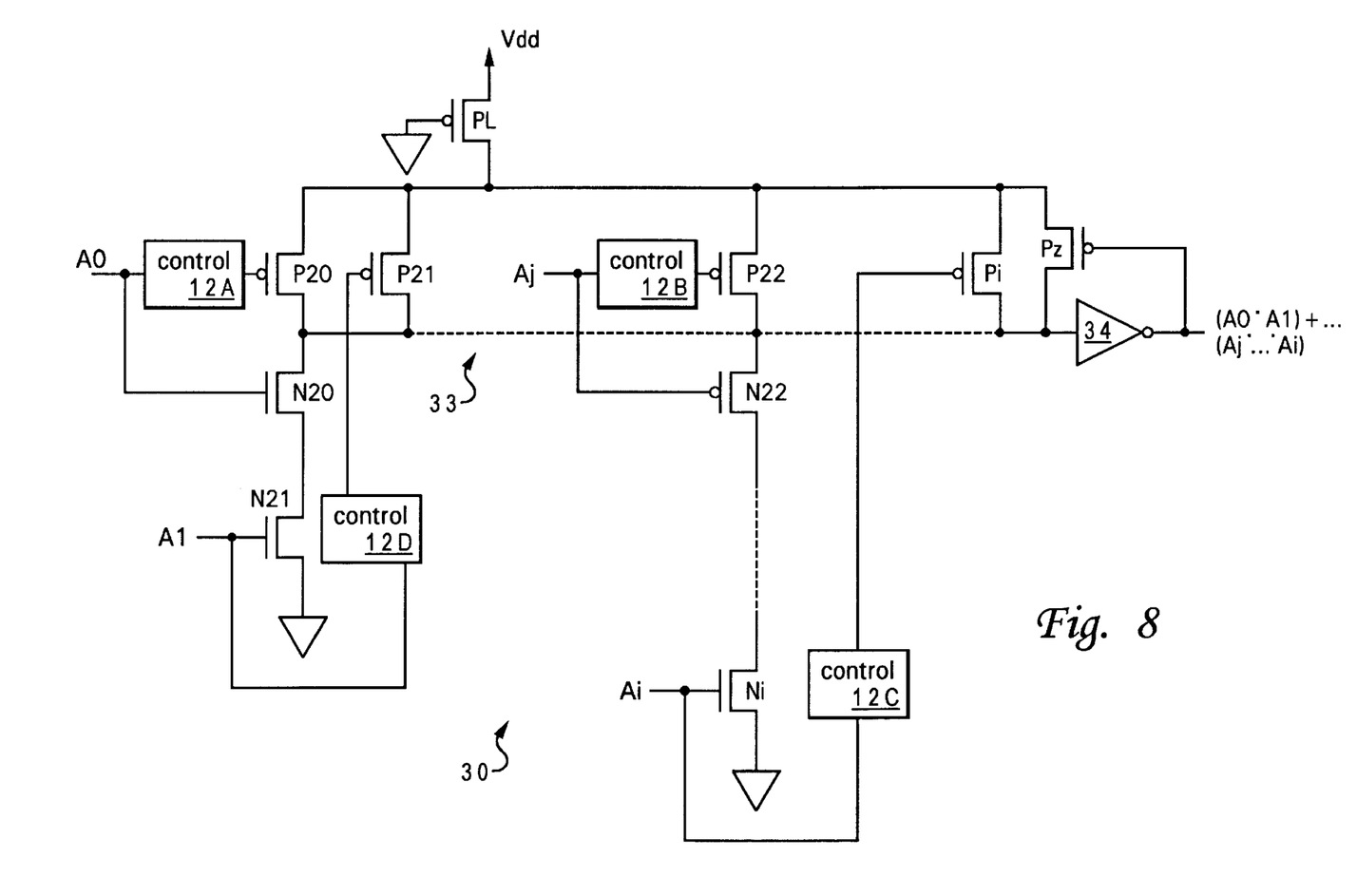
FIG. 8 is an electrical schematic of an AND-OR logic gate in accordance with yet another embodiment of the present invention.

Referring now to FIG. 8 a combination wide OR stacked AND logic gate 30 is depicted in accordance with a third embodiment of the invention. This gate is similar in operation to the wide OR 10 of FIG. 2. Input ladders in this gate 30 comprise more than one NMOS transistor, in order to perform and AND function. The ladders are connected to summing node 33 in parallel to provide the OR function, resulting in an evaluation of (A0·A1)+ . . . +(Aj· . . . Ai) Since all of the NMOS transistors in a ladder must be conducting for the ladder to pull down summing node 33, the contribution of each ladder is a NAND function. Summing node 33 produces the logical AND of all the NAND contributions, since it will be pulled low if any of the ladders conduct, and inverter 34 inverts this AND result to produce NAND of NAND contributions, which by De Morgan's theorem results in OR of AND contributions.

For circuits having ladders with more than one transistor, a control 12 is provided for every transistor in each ladder, along with an associated pulling device. Since an input change at any of the transistors in a ladder may result in the ladder ceasing conduction (the condition under which the quick charging by pulling devices is required), each input operates a control 12 which enables a pullup P20 through Pi that can quickly charge summing node 33. The input ladder comprising N22 through Ni, is shown to illustrate that the ladder may have a variable quantity of AND terms each with a transistor N, a control 12 and a pullup Pi associated with each other. Limiting transistor PL is again provided to control the overall current used to pull up summing node 33 and keeper Pz is provided to maintain the state of summing node 33 after controls 12 have disabled their pullups when all logic ladders are off.

Although the invention has been described with reference to specific embodiments, this description should not be construed in a limiting sense. Various modifications of the disclosed embodiments, as well as alternative embodiments of the invention, will become apparent to persons skilled in the art upon reference to the description of the invention. For example, the control means of the present invention could be adapted to other logic families such as dynamic logic gates. The control means of the present invention could also be used to control other circuits. It is therefore contemplated that such modifications can be made without departing from the spirit or scope of the present invention as defined in the appended claims.

What is claimed is:

1. A logic gate comprising:
    at least one input ladder having an output coupled to a summing node and an input coupled to a logic input, for pulling said summing node to a first logic rail when said logic input is in a given state;
    at least one pulling means for pulling said summing node to a second logic rail; and
    at least one control means coupled between said logic input and said pulling means for enabling said pulling means for a duration sufficient for said summing node to change logic states, in response to a logic transition of a data signal at said logic input.

2. The logic gate of claim 1, wherein said at least one input ladder comprises a plurality of input ladders, said at least one pulling means comprises a plurality of pulling means each associated with a respective transistor in one of said plurality of input ladders, said at least one control means comprises a plurality of control means each associated with a respective one of said plurality of pulling means, and each of said control means further enables an associated one of said pulling means associated with an associated one of said transistors when said associated one of said transistors ceases to conduct.

3. The logic gate of claim 1, wherein said control means comprises a pass gate for coupling said logic input to said pulling means.

4. The logic gate of claim 3, wherein said pass gate is enabled by a signal derived from said logic input.

5. The logic gate of claim 3, further comprising at least one delay means coupled to said logic input for producing a delayed signal, and said pass gate is disabled by said delayed signal.

6. The logic gate of claim 5, wherein said control means further comprises a first inverter for producing an inverted signal, said delay means comprises a second inverter coupled to an output of said first inverter, and said pass gate is enabled by said inverted signal.

7. The logic gate of claim 1, wherein said control means further comprises at least one delay means coupled to said logic input for producing a delayed signal, and said control means disables said pulling means in response to said delayed signal.

8. The logic gate of claim 7, wherein said control means further comprises a first inverter for producing an inverted signal and said delay means comprises a second inverter coupled to an output of said first inverter.

9. The logic gate of claim 1, further comprising keeper means for maintaining the state of said summing node after said control means ceases to enable said pulling means.

10. A method of controlling the operation of a logic gate having at least one input ladder coupled to a summing node and a logic rail, comprising the steps of:

detecting that an input to said logic gate has changed in a direction that will cause at least one of said input ladders to cease conduction;

enabling at least one pulling means to pull said summing node to a rail opposite said logic rail; and disabling said pulling means after sufficient time has elapsed for said summing node to change logic state.

11. The method of claim 10, wherein said at least one input ladder comprises a plurality of input ladders, said at least one pulling means comprises a plurality of pulling means each associated with a respective transistor in one of said plurality of input ladders, and said enabling step further enables an associated one of said pulling means associated with an associated one of said transistors when said associated one of said transistors ceases to conduct.

12. The method of claim 10, wherein said enabling step further enables said pulling means by activating a pass gate that couples said input to said pulling means.

13. The method of claim 12, wherein said enabling step activates said pass gate in conformance with a signal derived from said input.

14. The method of claim 12, further comprising the step of delaying said input to produce a delayed signal, and said disabling step further disables said pulling device in conformance with said delayed signal.

15. The method of claim 14, further comprising the step of inverting said input to produce an inverted signal, said step of delaying further second inverts said inverted signal, and said step of enabling further enables said pulling device in conformance with said inverted signal.

16. The method of claim 10, further comprising the step of delaying said input to produce a delayed signal, and said disabling step further disables said pulling device in conformance with said delayed signal.

17. The method of claim 16, further comprising the step of inverting said input to produce an inverted signal, said step of delaying further second inverts said inverted signal, and said step of enabling further enables said pulling device in conformance with said inverted signal.

18. The method of claim 10, further comprising the step of keeping the state of said summing node after said enabling step ceases to enable said pulling means.

* * * * *

UNITED STATES PATENT AND TRADEMARK OFFICE
CERTIFICATE OF CORRECTION

PATENT NO. : 6,292,027 B1
DATED : September 18, 2001
INVENTOR(S) : Dhong et al.

It is certified that error appears in the above-identified patent and that said Letters Patent is hereby corrected as shown below:

<u>Title page,</u>
Item [75], Inventors, delete "Sand" and insert -- Sang --.

Signed and Sealed this

Thirtieth Day of April, 2002

Attest:

Attesting Officer

JAMES E. ROGAN
*Director of the United States Patent and Trademark Office*